United States Patent [19]

Nagae et al.

[11] Patent Number: 4,548,474
[45] Date of Patent: Oct. 22, 1985

[54] INFORMATION HOLDING DEVICE

[75] Inventors: Yoshiharu Nagae, Hitachi; Hideaki Kawakami, Mito, both of Japan

[73] Assignee: Hitachi, Ltd., Tokyo, Japan

[21] Appl. No.: 521,900

[22] Filed: Aug. 10, 1983

[30] Foreign Application Priority Data

Aug. 23, 1982 [JP] Japan ................ 57-144713

[51] Int. Cl.⁴ .............................. G02F 1/13
[52] U.S. Cl. ................... 350/333; 350/351; 350/331 T
[58] Field of Search .......... 350/331 T, 351, 333

[56] References Cited

U.S. PATENT DOCUMENTS 4,150,396 4/1979 Hareng et al. .......... 350/351 X
4,279,152 7/1981 Crossland .......... 350/351 X Primary Examiner—John K. Corbin
Assistant Examiner—Richard F. Gallivan
Attorney, Agent, or Firm—Antonelli, Terry & Wands

[57] ABSTRACT

An information holding device comprises a pair of substrates having a first electrode and a second electrode oppositely formed on opposing surfaces thereof, and a dielectric material disposed between the pair of substrates. A capacitance of a dielectric material portion disposed between the first electrode and the second electrode is changed and detected.

20 Claims, 26 Drawing Figures

INFORMATION HOLDING DEVICE

BACKGROUND OF THE INVENTION

The present invention relates to an information holding apparatus, and more particularly to such an apparatus capable of outputting stored information to an external device.

In the past, a device made of a liquid crystal having a smectic phase with a display function and an information holding function and a device made of a dielectric material such as PLZT have been known as the information holding device. Hereinbelow, a liquid crystal device having the display function and the information holding function is explained as an example of the information holding device.

The liquid crystal devices of various display principles having a liquid crystal having a nematic phase, a liquid crystal having a cholesteric phase or a liquid crystal having a smectic phase have been known. In those devices, orientations of liquid phase molecules are changed by an external field and the resulting change of an optical property is used to display the information. As an example of such liquid crystal devices, a thermal writing type liquid crystal device disclosed in the U.S. Pat. No. 3,796,999 "Locally Erasable Thermo-Optic Smectic Liquid Crystal Storage Displays" is explained below.

In the disclosed device, transparent electrodes 13 and 14 are arranged on the inner surfaces of a pair of glass substrates 11 and 12 as shown in FIG. 1a and a liquid crystal 15 having a smectic phase is filled therebetween. A laser beam 16 emitted from an argon (Ar) laser or a yttrium-aluminum-garnet (YAG) laser is focused on the display panel through a lens 17 to heat the smectic liquid crystal 15 of a area 18 to be displayed, thereby rendering it an isotropic liquid crystal phase.

Then, the laser beam is removed to quickly cool the liquid crystal to the smectic phase. As a result, orientations of the liquid crystal molecules are disturbed and a region 19 which exhibits a strong scattering property is produced. Since this scattered state persists stably, a desired image information can be stored.

Based on the display principle described above, the thermal writing type display device can write a desired image information on the liquid crystal elements by the scan and the modulation of the laser beam, and local erasure is attained by the application of an electric field. Thus, it is preferable as a display device but it does not have a function to read out the stored image information or a function to output the information to an external device such as a computer and it is merely used as an input device of an image information signal.

The other known liquid crystal devices also have only the function of displaying the image and they are not used as the information output devices.

SUMMARY OF THE INVENTION

It is an object of the present invention to provide an information holding device made of a liquid crystal having a smectic phase, which has a function of reading out information to allow the input and output of an information signal.

It is a second object of the present invention to provide an information holding device having picture elements or cells arranged in an X-Y matrix, which is not affected by a cross-talk current and can input and output an information signal with a simple circuit.

In the present invention, it is noticed that a capacitance of a dielectric material such as a liquid crystal having a smectic phase differs between an initial state and a write state, and means for detecting the capacitance is provided.

The term "dielectric material" hereinused means a dielectric material the capacitance of which changes by the application of an electric field or a heat and the capacitance does not change but maintained or stored for a predetermined time period after the removal of the electric field or the heat. Examples of such a dielectric material are a liquid crystal having the smectic A phase, a liquid crystal having the cholesteric phase or PLZT. It is preferable to use a liquid crystal having the smectic A phase which can write the information at a relatively low temperature and has a long store time.

BRIEF DESCRIPTION OF THE DRAWINGS

The other objects and features of the present invention will be apparent from the following description of the preferred embodiments taken in conjunction with the accompanying drawings, in which.

DETAILED DESCRIPTION OF THE PREFERRED EMBODIMENTS

The present invention will now be explained in detail for a liquid crystal having the smectic A phase.

EMBODIMENT 1

A first embodiment of the present invention is explained with reference to FIGS. 2, 3 and 4.

A liquid crystal panel 200 comprises a pair of substrates 230 and 240 having electrodes 210 and 220 on opposing surfaces thereof and having a gap of approximately 10 μm therebetween, in which a liquid crystal 250 having a smectic A phase is filled.

The substrates 230 and 240 may be glass plates or plastic plates, or the non-viewing substrate may be an opaque substrate such as a Si-substrate and the viewing substrate may be a transparent substrate such as a glass plate or a plastic plate.

The electrodes 210 and 220 may be transparent conductive films such as mixture of indium oxide and tin oxide, or the electrode on the viewing substrate may be the transparent conductive film and the other electrode may be a metal such as Al or Cr.

The liquid crystal material may be mixture including

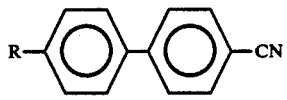

(where R is an alkali radical) which exhibit a positive dielectric anisotropy and the smectic A phase at room temperatures and changes from the smectic phase to a nematic phase at 42° C. and from the nematic phase to an isotropic liquid phase at 45° C.

Other liquid crystals having the smectic A phase are mixture of 4, 4'-alchoxy byphenyl carboxylic acid alkyl ester and 4, 4'-alkyl cyanotran and mixture of 4-alchoxy phenyl-4'-alkyl benzoic acid ester and p,p'-alkyl cyano biphenyl. When dichroic dye is added to the liquid crystal, a viewing angle property of display is improved and it is desirable to the display device.

Figure 3:
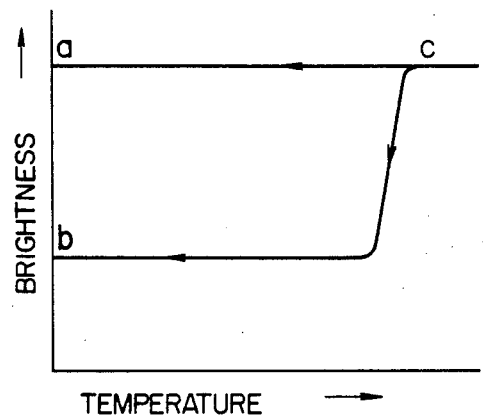
FIG. 3 shows a temperature characteristic of a liquid crystal used in the embodiment of the present invention.

FIG. 3 shows an optical characteristic of the liquid crystal having the smectic phase. When the liquid crystal having the smectic phase is heated, it exhibits an isotropic liquid phase (point c) and an essentially transparent state. When the liquid crystal layer is cooled while a sufficient voltage is applied thereto, it exhibits a smectic phase (point a) and an essentially transparent state, and this state is retained (non-write state).

On the other hand, when the voltage applied to the liquid crystal layer is set to or around zero volt, it exhibits a smectic phase having a scattering property (point b) and a brightness is reduced. This state is retained thereafter (write state).

The present inventors have found that when the voltage applied to the liquid crystal layer is changed in the course of cooling of the liquid crystal layer, the amount of scatter changes so that a tonality is imparted to the display. The inventors have also found that a static capacitance of the liquid crystal having the smectic phase does not substantially change for several days to several months after the electric field or the heat has been removed.

Interfaces between the electrodes 210 and 220 and the liquid crystal having the smectic phase are treated with silane surface active agent so that they are homeotropically oriented, that is, the liquid crystal molecules having the smectic phase are oriented in a direction perpendicularly to the substrates, although they may be oriented in a direction parallel to the substrates.

The liquid crystal material is not limited to the liquid crystal having the smectic phase but it may be other liquid crystal such as a liquid crystal having a cholesteric phase whose orientation is changed by the application of an external field and retained for a predetermined time period after the external field has been removed.

Figure 4:
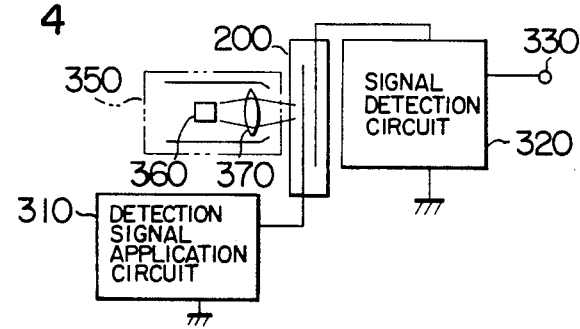
FIG. 4 is a block diagram of the first embodiment of the present invention.

FIG. 4 shows capacitance detecting means to be connected to the liquid crystal panel 200. It comprises a detection signal application circuit 310 and a signal detection circuit 320, and a detected information signal is produced at an output terminal 330.

As information write means is provided a laser pen 350 which can focus a laser beam at any point. The laser pen 350 comprises an optical fiber which guides the laser beam from a laser beam source and a focusing lens, or it may comprise an integral structure of a semiconductor laser 360 and a focusing lens 370. The inventors have found that the information can be written by condensing a laser power of no less than 100 mW onto the surface of the liquid crystal.

Figure 5:
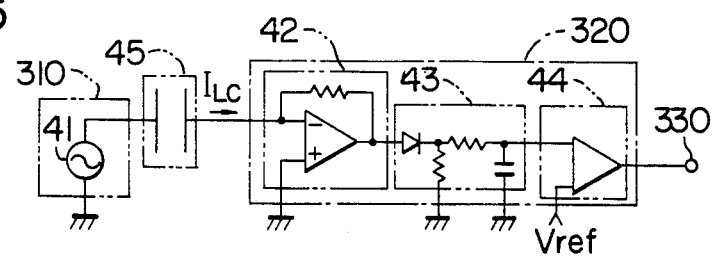
FIG. 5 shows a circuit used in FIG. 4.

An embodiment of the capacitance detection means is shown in FIG. 5.

The detection signal application circuit 310 is a sinusoidal wave oscillator 41 and the signal detection circuit 320 comprises a current-voltage converter circuit 42, a rectifier-filter circuit 43 and a comparator circuit 44.

An equivalent circuit when the opposing electrodes of the liquid crystal panel 200 is regarded as a capacitor is shown in FIG. 5.

The operation of the circuit of FIG. 5 is now explained. A capacitance of the opposing electrodes of the liquid crystal panel in the initial state (non-write state) is represented by $C_{NW}$ and that in the write state is represented by $C_W$.

As described above, the liquid crystal molecules are oriented vertically to the electrodes. Therefore, a specific dielectric constant of the liquid crystal layer is approximately equal to a specific dielectric constant $\epsilon_\parallel$ in the long-axis direction of the liquid crystal molecules.

In the write state, the orientation of the liquid crystal molecules is significantly disturbed. Assuming that the orientation is perfectly random, the specific dielectric constant of the liquid crystal layer is equal to a three-dimensional average of the $\epsilon_\parallel$ and a specific dielectric constant $\epsilon_\perp$ in the short-axis direction of the liquid crystal molecules, that is, $(\epsilon_\parallel + 2\epsilon_\perp)/3$.

Accordingly, $C_{NW}$ and $C_W$ meet the following relation.

$$\frac{C_{NW}}{C_W} = \frac{\epsilon_\parallel}{\frac{1}{3}(\epsilon_\parallel + 2\epsilon_\perp)} \quad (1)$$

The inventors filled perpendicularly oriented liquid crystal material having the specific dielectric constants of $\epsilon_\parallel = 12$ and $\epsilon_\perp = 4.7$ in the display panel having the electrode spacing of approximately 10 μm and got $C_{NW} = 13.1$ pF and $C_W = 8.85$ pF.

Thus, $C_{NW}/C_W = 1.48$ which is close to a theoretical value ($C_{NW}/C_W = 1.68$) in accordance with the formula (1).

When a sinusoidal wave voltage is applied by the sinusoidal wave oscillator circuit 41 of the detection signal application circuit 310 to the capacitor 45 whose capacitance changes between the write state and the non-write state, a current $I_{LC}$ determined by the capacitance flows.

This current $I_{LC}$ is converted to a voltage signal by the current-voltage converter circuit at the first stage of the signal detection circuit 320 and converted to a D.C. voltage by the rectifier-filter circuit 43 at the next stage, and it is supplied to the comparator circuit 44 at the final stage.

The comparator circuit 44 compares the input voltage with a reference voltage and produces a compare result. As described above, the capacitance of the capacitor 43 is smaller in the write state than in the non-write state. Accordingly, if the reference voltage is properly selected, the output is at "low" level in the write state and at "high" level in the non-write state.

Accordingly, the orientation of the liquid crystal can be detected.

EMBODIMENT 2

Figure 6:
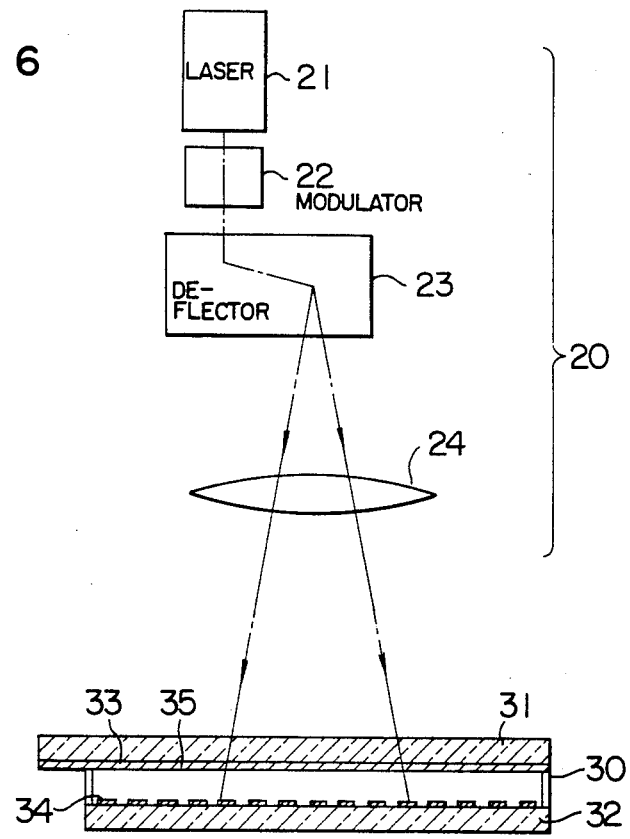
FIG. 6 is a sectional view of a second embodiment of the present invention.

FIG. 6 shows a sectional view of a second embodiment of the present invention. An optical system 20 for writing an information signal such as an image signal in the liquid crystal elements comprises a laser 21 as a heat source, a modulator 22 for modulating a laser beam, an X-direction and Y-direction deflector 23 for deflecting the laser beam to a desired direction, and a lens 24 for focusing the laser beam on the liquid crystal elements.

The laser 21 may be a YAG laser having an output power of 1 W in a signal mode and a beam divergence of no more than 1 mrad.

The modulator 22 may be an acoustic-optical modulator and the deflector 23 may be a plane mirror (galvanometer) which can control an angle by a current. The liquid crystal panel 30 is similar to that shown in FIG. 2. That is, a pair of glass or plastic substrates 31 and 32 are arranged to leave a gap of approximately 10 μm therebetween and a liquid crystal 35 having a smectic phase is filled therein with a perpendicular orientation to the substrates.

Figure 1A:
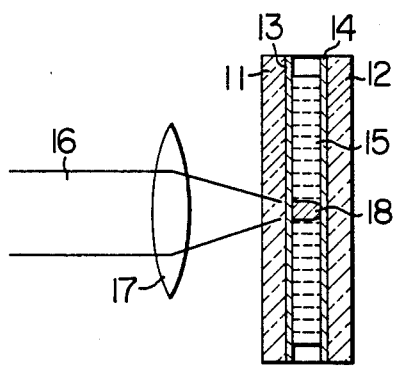
FIGS. 1a and 1b illustrate a principle of thermal writing to a liquid crystal panel.
Figure 1B:
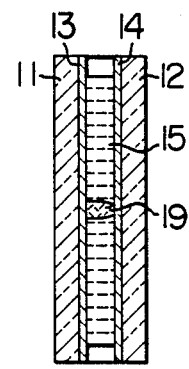
Figure 2:
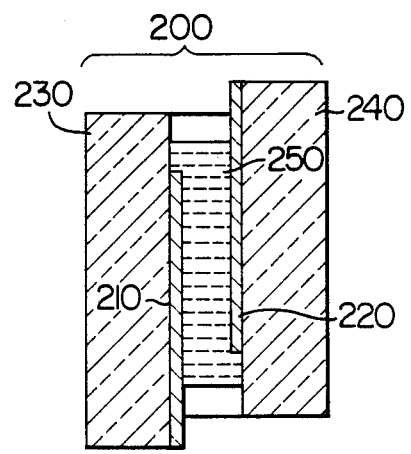
FIG. 2 is a sectional view of a first embodiment of the present invention.

A difference from the liquid crystal panel 200 shown in FIG. 2 resides in the number of electrodes.

The pair of glass substrates 31 and 32 each has transparent X and Y electrodes 33 and 34 of stripe shape extending in X and Y directions and cells formed by the opposing X and Y electrode portions and the liquid crystal portions therebetween are arranged in a matrix as a whole.

The inventors irradiated a laser beam having an output power of approximately 50 mW to the surface of the liquid crystal panel 30 and got an excellent display of the information signal.

Figure 7:
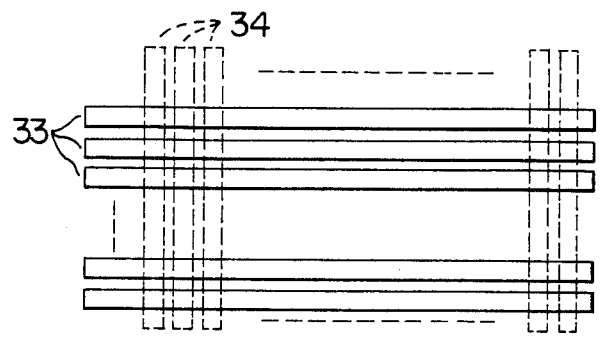
FIG. 7 is a plan view of an electrode structure of FIG. 6.
Figure 8:
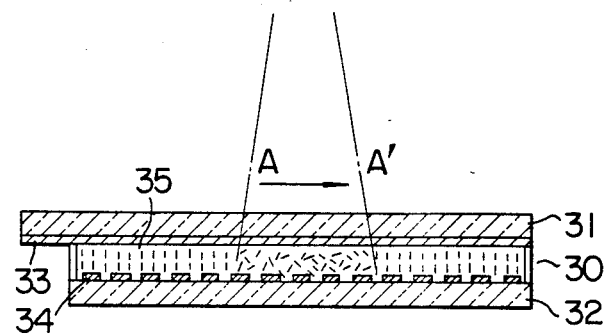
FIG. 8 is a sectional view showing a write state and non-write state of a cell of FIG. 6.
Figure 9:
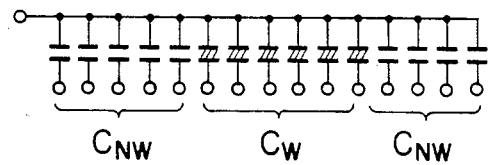
FIG. 9 is an equivalent circuit when the cell of FIG. 8 is regarded as a capacitor.

FIG. 8 illustrates the orientation of the liquid crystal molecules when the position of the laser beam is moved from A to A' in the liquid crystal device of FIG. 7 to render the portion irradiated by the laser beam to assume the write state.

The orientation of the liquid crystal molecules in the write state is disordered as opposed to that in the non-write state. In the non-write state, the liquid crystal molecules are oriented perpendicularly (homeotropic orientation) by the perpendicular orientation treatment in the manufacture of the liquid crystal device, although they may be oriented parallel to the substrates.

As described above, the smectic liquid crystal has the positive dielectric anisotropy. Thus, the specific dielectric constant $\epsilon_\parallel$ in the long-axis direction of the liquid crystal molecules is larger than the specific dielectric constant $\epsilon_\perp$ in the short-axis direction. Since the liquid crystal molecules are oriented vertically to the electrodes in the non-write state, the dielectric constant of the liquid crystal layer can be substantially regarded as $\epsilon_\parallel$. In the write state, since the orientation of the liquid crystal molecules is disordered, the dielectric constant of the liquid crystal layer is smaller than $\epsilon_\parallel$ depending on the degree of disturbance. Assuming that they are perfectly randomly oriented, the dielectric constant is equal to $(\epsilon_\parallel + 2\epsilon_\perp)/3$.

Regarding that the cells at the opposing portions of the X electrodes 33 and Y electrodes 34 arranged in the X-Y matrix as capacitors, the liquid crystal panel of the cross-section shown in FIG. 8 can be regarded as capacitors having first ends thereof connected in common.

Since the cells are filled with the dielectric liquid crystal having the smectic phase between the electrodes, the capacitances thereof differ depending on the difference of the dielectric constants due to the difference of the orientations between the write state and the non-write state.

Accordingly, the static capacitance $C_W$ of the cell in the write state differs from the capacitance $C_{NW}$ of the cell in the non-write state as shown in FIG. 8. When the liquid crystal material having the positive dielectric anisotropy is used and the orientation is perpendicular in the non-write state, $C_W$ is smaller than $C_{NW}$. If the orientation is parallel, $C_W$ is larger than $C_{NW}$.

As described above, since the static capacitance of the cell in the write state is different from that in the non-write state, the difference in the static capacitance is electrically read out to recognize and output the written information signal.

Figure 10:
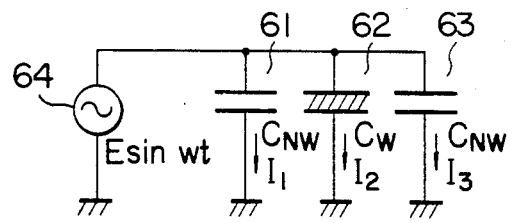
FIGS. 10 to 13 are equivalent circuits for illustrating a principle of detection of a capacitance of a dielectric material in accordance with the present invention.

An embodiment of means for detecting the capacitance of the opposing portions of the X electrodes and the Y electrodes is shown in FIG. 10.

In FIG. 10, the first ends of three cells (capacitors) 61, 62 and 63 are connected in common. When an A.C. voltage source 64 of $E \sin \omega t$ is connected to the common terminal, currents $I_1$, $I_2$ and and $I_3$ which flows from the respective cells to a ground are expressed by $$\left. \begin{array}{l} I_1 = I_3 = \dfrac{1}{\omega C_{NW}} \sin\left(\omega t - \dfrac{\pi}{2}\right) \\ I_2 = \dfrac{1}{\omega C_W} \sin\left(\omega t - \dfrac{\pi}{2}\right) \end{array} \right\} \quad (2)$$

Accordingly, the currents $I_1$, $I_2$ and $I_3$ detected meet a relation of $|I_2| < |I_1|, |I_3|$ so that the information in the cell in the write state is recognized.

While the recognition of the write state and the non-write state is specifically described herein, a half-tone of the image display can also be recognized.

In order to detect the capacitance of the cells arranged in the X-Y matrix, a special device to prevent crosstalk currents is necessary.

Figure 11:
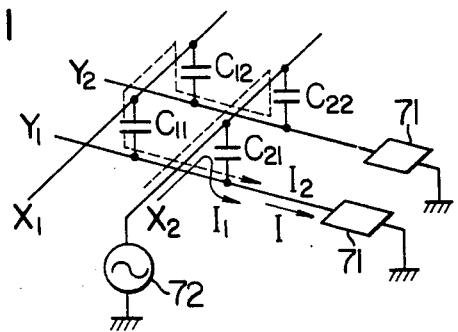

The cross-talk currents are explained in an example of 2-rows by 2-columns cell matrix shown in FIG. 11.

When a current I flowing through a cell $C_{21}$ in FIG. 11 is measured by a signal detection circuit 71, the current I is a sum of a current $I_1$ flowing from an X electrode $X_2$ to which a voltage source 72 is connected, through the cell $C_{21}$ and a current $I_2$ which flows through cells $C_{22}$, $C_{12}$ and $C_{11}$ as shown by a broken line in FIG. 11. Therefore, the current I is different from the current $I_1$ flowing through the cell $C_{21}$ which is to be detected.

Further, since the magnitude of $I_2$ differs depending on the capacitances of the cells $C_{22}$, $C_{12}$ and $C_{11}$, the magnitude of I differs depending on the states of the cells, and the capacitance of $C_{21}$ and hence the write state of the cell corresponding to $C_{21}$ cannot be exactly detected. This is a shortcoming due to the cross-talk current and this phenomenon should be eliminated.

Figure 12:
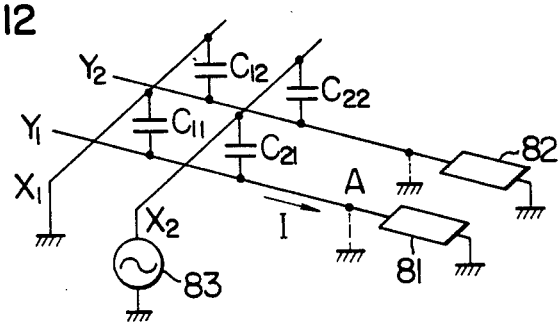

To this end, as shown in FIG. 12, the X electrode $X_1$ is grounded, the X electrode $X_2$ is connected to a voltage source 83 and a potential at an input terminal (point A) of the signal detection circuit 81 is kept substantially at a ground potential. Since the X electrode $X_1$ and the Y electrodes $Y_1$ and $Y_2$ which form the cells (capacitors) $C_{11}$ and $C_{12}$ are substantially at the ground potential, no current flows through the cells $C_{11}$ and $C_{12}$. Thus, the cross-talk current $I_2$ shown in FIG. 11 no longer flows. Accordingly, the current I which flows into the signal detection circuit 81 comprises only the current flowing through the cell $C_{21}$ and hence the capacitance of the cell $C_{21}$ can be exactly detected. Accordingly, the write state of the cell corresponding to $C_{21}$ can be exactly recognized.

The capacitance of the cell $C_{22}$ can be similarly detected by the signal detection circuit 82, and the state of the cell connected to the electrode $X_2$ is recognized. When the voltage source 83 is connected to the electrode $X_1$ and the electrode $X_2$ is grounded, the state of the cell connected to the electrode $X_1$ is detected. Thus, by sequentially scanning the X electrodes, the states of all cells can be recognized.

Since the orientation of the liquid crystal molecules changes when a voltage larger than a certain threshold is applied, the voltage of the voltage source 83 applied to detect the capacitance should be lower than the threshold of the liquid crystal in order to prevent the change of the capacitance.

Figure 13:
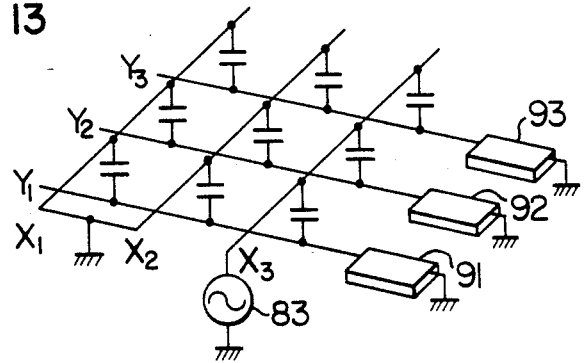

While the detection method for the capacitance has been described for the 2-rows by 2-columns matrix, the present method can be readily applied to a larger scale matrix. FIG. 13 shows an example of 3-rows by 3-columns matrix.

In FIG. 13, capacitances of the cells connected to the X electrode $X_3$ are detected. The X electrodes $X_1$ and $X_2$ other than $X_3$ are grounded to prevent the cross-talk currents and the static capacitances of the cells connected to the electrode $X_3$ are detected by the signal detection circuits 91, 92 and 93 to determine the write and non-write states.

Similarly, when the voltage source is connected to the electrode $X_1$ and the electrodes $X_2$ and $X_3$ are grounded, the write and non-write states of the cells connected to the electrode $X_1$ are determined. When the electrode $X_2$ is connected to the voltage source $X_2$ and the electrodes $X_1$ and $X_3$ are grounded, the write and non-write states of the cell connected to the electrode $X_2$ are determined.

Figure 14:
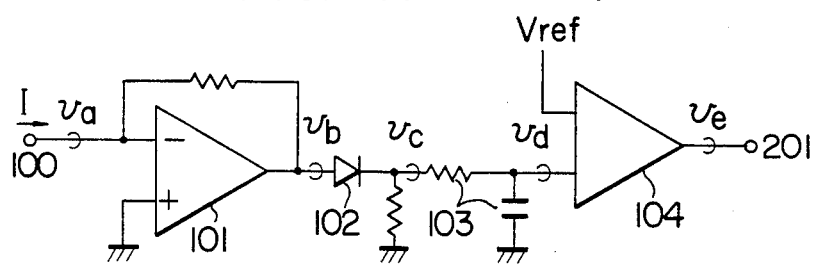
FIG. 14 shows a signal detection circuit in the second embodiment of the present invention.

FIG. 14 shows an embodiment of the signal detection circuit. It comprises a current-voltage converter circuit having an operational amplifier 101, a rectifier circuit 102, a filter circuit 103 and a comparator circuit 104, and detects an A.C. current flowing into an input terminal 100 to produce a "1" or "0" signal at an output terminal 201. In the present circuit, since a potential at the input terminal 100 is substantially ground potential, the cross-talk current is prevented as described above and an excellent detection circuit is provided.

Figure 15A:
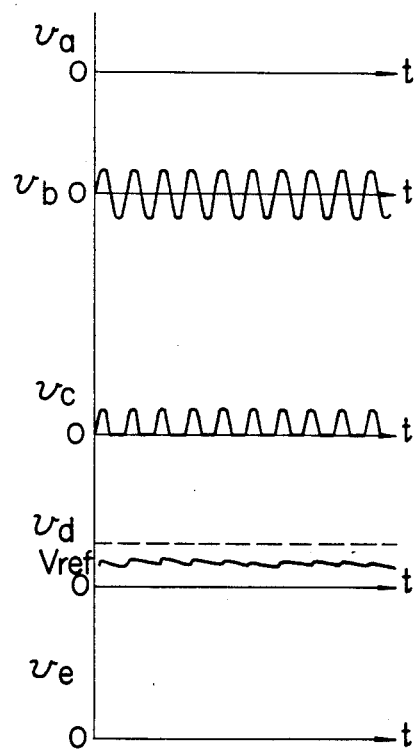
FIGS. 15a and 15b show waveforms in the circuit of FIG. 14.
Figure 15B:
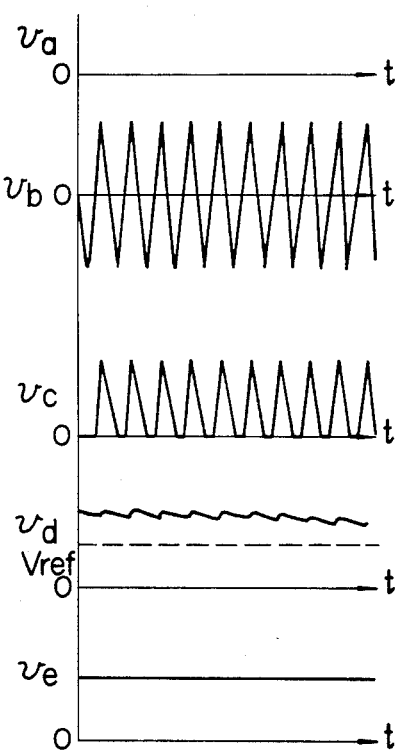

FIGS. 15a and 15b show waveforms in the circuit of FIG. 14. FIG. 15a shows the detection of the capacitance $C_W$ of the cell in the write state and FIG. 15b shows the detection of the capacitance $C_{NW}$ of the cell in the non-write state, where $C_W < C_{NW}$.

The operational amplifier 101 acts as a current amplifier. Since the input terminal 100 is at a virtual ground potential as described above, a voltage $v_a$ is zero. The current I is converted to a voltage $v_b$ which is rectified by a diode of the rectifier circuit, which produces a voltage $v_c$. It is filtered by the filter circuit 103 to produce a substantially D.C. voltage $v_d$. By selecting a reference voltage $V_{Ref}$ of the comparator circuit 104 as shown by a broken line in FIGS. 15a and 15b, an output voltage $v_e$ of the comparator circuit 104 is "0" for the write state cell of FIG. 15a and "1" for the non-write state cell of FIG. 15b. Thus, the static capacitance can be determined.

While the circuit shown in FIG. 14 determines the binary states, that is, "0" or "1", the half-tone in the image display may be determined by changing the reference voltage $V_{Ref}$.

Figure 16:
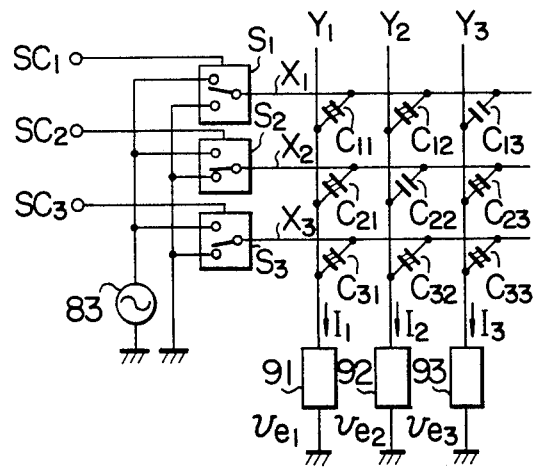
FIG. 16 is a schematic view of an overall configuration of the second embodiment of the present invention.
Figure 17:
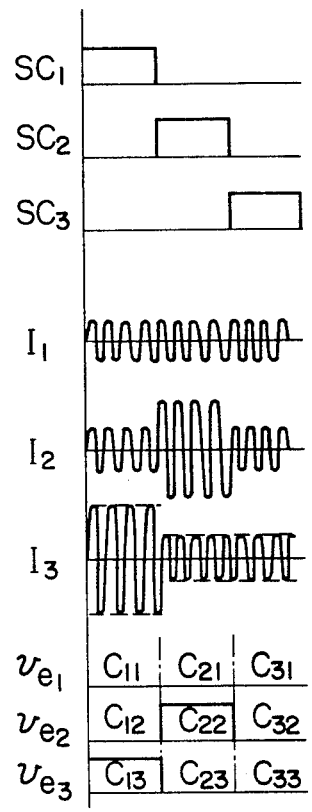
FIG. 17 shows waveforms in the circuit of FIG. 16.

FIG. 16 shows an embodiment of an overall device which uses the 3 rows by 3 columns matrix shown in FIG. 13, and FIG. 17 shows waveforms in the circuit of FIG. 16.

Switches $S_1$, $S_2$ and $S_3$ sequentially select the X electrodes, starting from $X_1$, which are held at the ground potential, by control signals $SC_1$, $SC_2$ and $SC_3$, and connect the selected X electrode to the voltage source 83. Signal detection circuits 91, 92 and 93 each has the circuit construction as shown in FIG. 13.

In FIG. 16, when the cells $C_{11}$, $C_{12}$, $C_{21}$, $C_{23}$, $C_{31}$, $C_{32}$ and $C_{33}$ are in the write state, the cells $C_{13}$ and $C_{22}$ are in the non-write state and $C_W < C_{NW}$, the signal detection circuits 91, 92 and 93 produce the output voltages $v_{e1}$, $v_{e2}$ and $v_{e3}$ as shown in FIG. 17 so that the capacitances of the respective cells are detected and the information signals of the respective cells are determined.

EMBODIMENT 3

Figure 18:
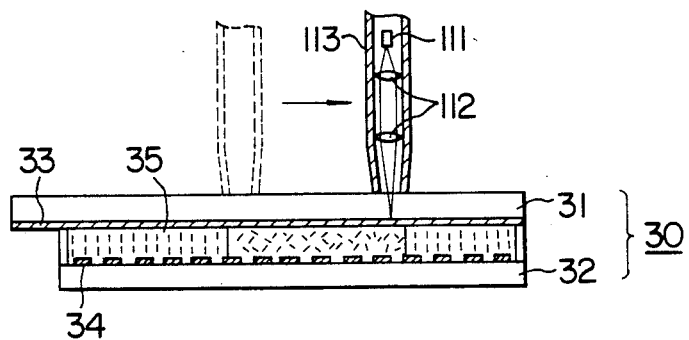
FIG. 18 is a sectional view of a third embodiment of the present invention.

FIG. 18 shows a third embodiment for writing the information signal, in which the like numerals to those shown in FIG. 6 designate the like elements.

The present embodiment uses a write pen 113 having a semiconductor laser 111 and a focusing optical system 112 to write information signals such as image signals to cells of a liquid crystal panel 30 in a direction shown by an arrow. The written information signals are outputted to an external device in the same manner as that described above.

The present invention can make the entire device more compact.

EMBODIMENT 4

Figure 19:
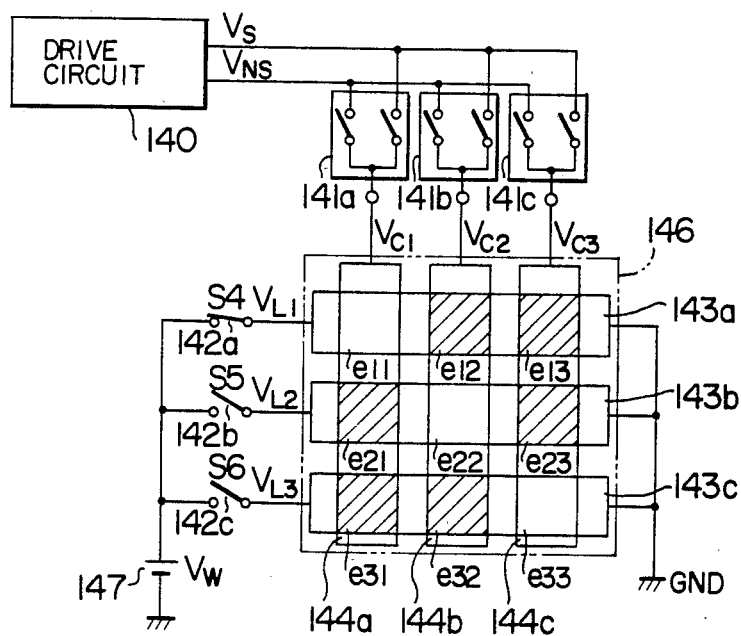
FIG. 19 shows a fourth embodiment of the present invention.
Figure 20:
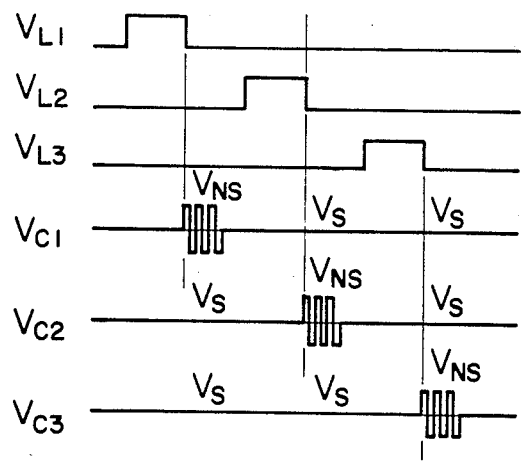
FIG. 20 shows waveforms in FIG. 19.

Another embodiment of information write means for the liquid crystal panel which uses the liquid crystal having the smectic phase is shown in FIGS. 19 and 20.

A structure of a liquid crystal panel 146 is identical to that of the liquid crystal panel shown in FIGS. 6 and 7. Switches 142a-142c are connected to first terminals of X electrodes 143a-143c formed on one substrate and second terminals are connected to ground (0 volt).

Switch pairs 141a-141c are connected to Y electrodes 144a-144c formed on the other substrate. The switches 142a-142c are connected to a heating power supply 147 and the switch pairs 141a-141c are connected to a drive circuit 140, which produces a selection voltage $V_S$ and a non-selection voltage $V_{NS}$ ($V_S < V_{NS}$ in effective value).

The voltage $V_S$ changes around the point c to point b in FIG. 3, and it is around zero volt in the present embodiment. The voltage $V_{NS}$ changes around the point c to point a in FIG. 3 and it is not limited to a pulse wave as shown in FIG. 20 but it may be a sine wave or an intermittent pulse wave. In order to prevent degradation of the liquid crystal, an A.C. waveform having a zero average value is preferable.

Voltages applied to the X electrodes 143a–143c and the Y electrodes 144a–144c when hatched picture cells $e_{12}$, $e_{13}$, $e_{21}$, $e_{23}$, $e_{31}$ and $e_{32}$ of the picture cells of the liquid crystal panel 146 assume the write state (scattered state) and the other picture cells $e_{11}$, $e_{22}$ and $e_{23}$ assume the non-write state (transparent state) are shown in FIG. 20.

The switch pairs 141a–141c are turned off and the switch 142a is turned on for a predetermined time to apply the heating voltage $V_W$ to the X electrode 143a. As a result, the X electrode 143a is heated and the liquid crystal is heated by a joule heat so that it shifts from the smectic phase to the isotropic liquid phase.

When the switch 142a is turned off to remove the heating voltage $V_W$, the liquid crystal is rapidly cooled. At this time, only the switch pair 141a is turned onto select the non-selection voltage $V_{NS}$ while the other switch pairs 141b and 141c select the selection voltage $V_S$ ($\approx 0$). As a result, the hatched picture cells $e_{12}$ and $e_{13}$ assume the write state while the picture cell $e_{11}$ assumes the non-write state.

The above operation is sequentially repeated for the X electrodes 143b and 143c.

EMBODIMENT 5

Figure 21:
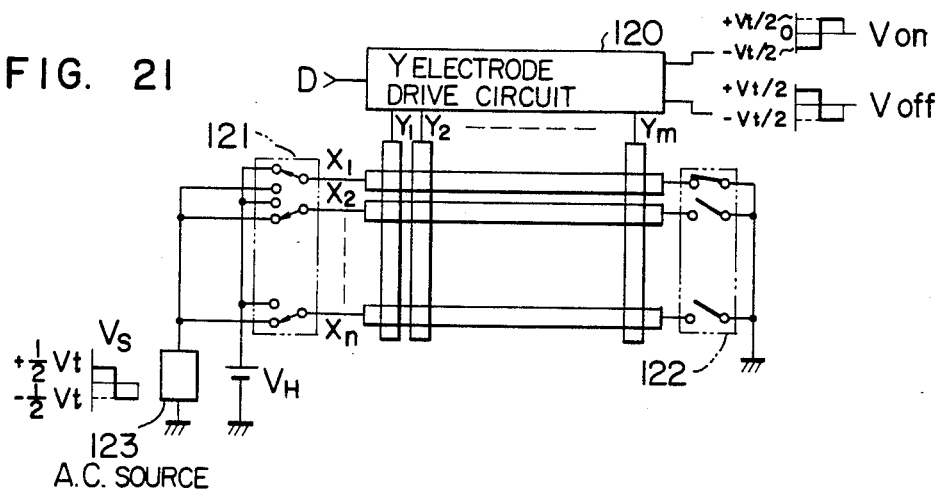
FIG. 21 shows a fifth embodiment of the present invention.
Figure 22:
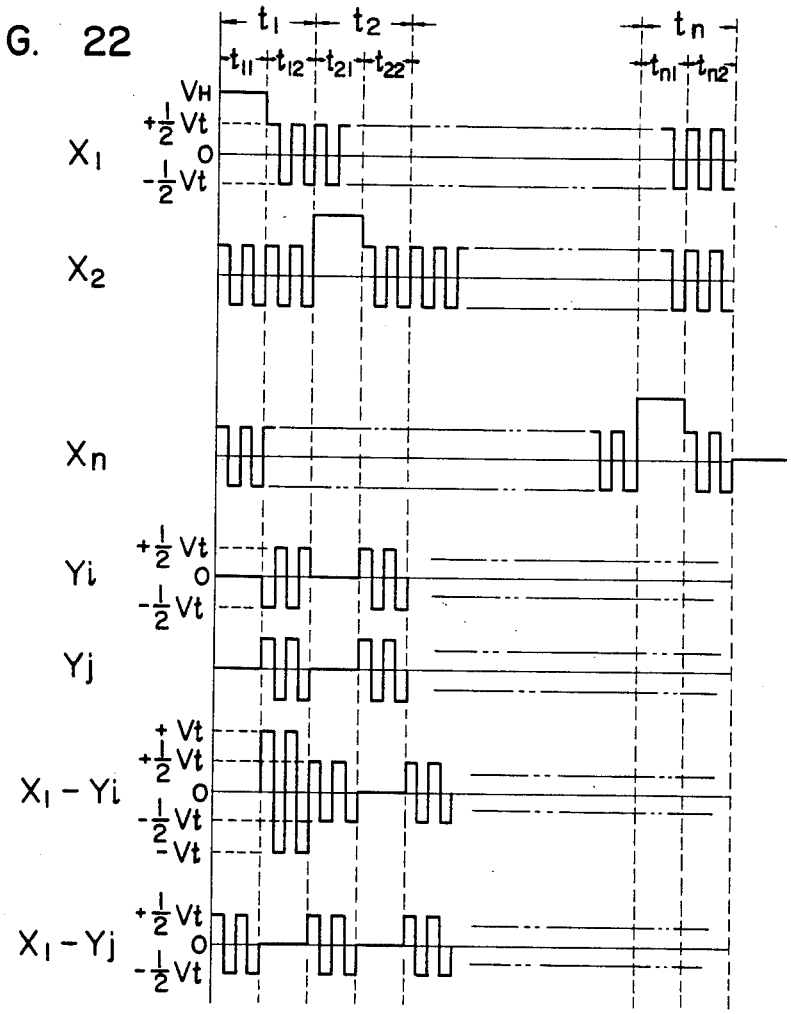
FIGS. 22 and 23 shows waveforms in FIG. 21.

Another embodiment of the information write means for the liquid crystal panel is shown in FIG. 21 and operational waveforms thereof are shown in FIG. 22.

In FIG. 21, numeral 120 denotes a Y electrode drive circuit and numeral 121 denotes an X electrode drive circuit, which comprises two-channel switches for switching a voltage source $V_H$ for heating the X electrodes. Numeral 122 denotes switches which are turned on when the switches of the circuit 121 select the heating voltage source $V_H$.

In the present embodiment, voltages as shown in FIG. 22 are applied to the left ends of the X electrodes $X_1, X_2, \ldots X_n$. At first halves of the time periods $t_1, t_2, \ldots t_n$, the switches select the heating voltage source $V_H$, and at second halves they select an A.C. voltage source 123. In the $X_1$ selection time $t_1$, one of the switches 122 corresponding to the selected row electrode is turned on in the first half time period $t_{11}$. Thus, the X electrode is heated and the liquid crystal shifts from the state a in FIG. 3 to the state c. In the second half period $t_{12}$, the switch 121 selects the A.C. voltage source $V_S$ and the switch 122 is turned off. At the same time, a signal $V_{on}$ or $V_{off}$ having an amplitude of $\pm \frac{1}{2} V_t$ depending on an input data signal D and an opposite phase is applied from the Y electrode drive circuit 120. The above operation is repeated to sequentially scan $X_2, X_3, \ldots X_n$. Accordingly, A.C. electric fields $X_1$-$Y_i$ and $X_1$-$Y_j$ as shown in FIG. 22 are applied to the liquid crystal. Thus, the display state is determined depending on the electric field state applied when the liquid crystal layer is cooled in the periods $t_{12}, t_{22}, \ldots t_{n2}$. In the present embodiment, while the A.C. voltage of $\pm \frac{1}{2} V_t$ is always applied to the non-selected X electrodes, the display state is not changed because the non-selected X electrodes are not heated.

Figure 23:
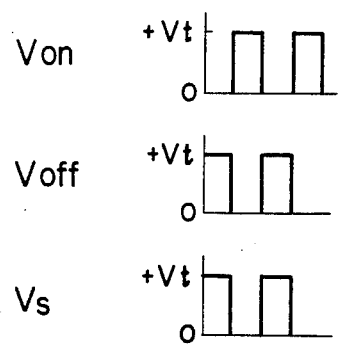

While the voltage of $\pm \frac{1}{2} V_t$ is used as the A.C. voltage applied to the X and Y electrodes in the present embodiment, the same effect will be attained when a single voltage source is used as shown in FIG. 23.

EMBODIMENT 6

Figure 24:
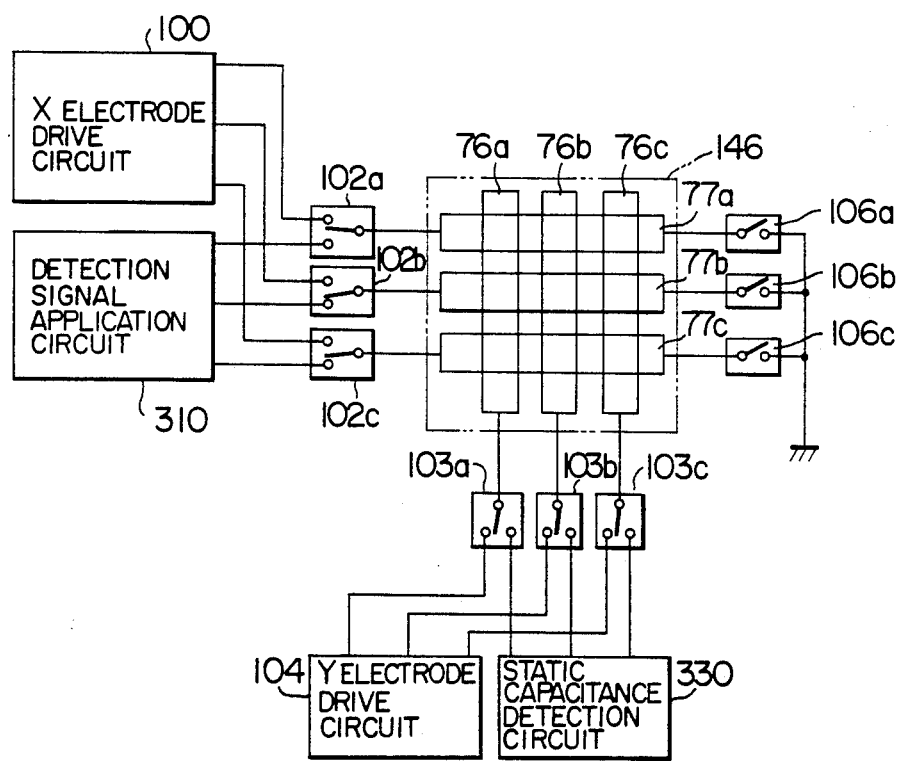
FIG. 24 shows a sixth embodiment of the present invention.

FIG. 24 shows another embodiment which integrates the information write and read circuits described above.

Switches 102a–102c are connected to first ends of X electrodes 77a–77c. First input terminals of the switches 102a–102c are connected to electrode drive circuit 100 and the second input terminals are connected to a detection signal application circuit 310.

Second ends of the X electrodes 77a–77c are connected to switches 106a–106c.

Switches 103a–103c are connected to Y electrodes 76a–76c. First input terminals of the switches 103a–103c are connected to a Y electrode drive circuit 104 and the second input terminals are connected to a static capacitance detection circuit 330.

In order to write information, the switches 102a–102c select the X electrode drive circuit 100 and the switches 103a–103c select the Y electrode drive circuit 104.

In the present embodiment, laser beam writing may be used. In the laser beam write mode shown in FIGS. 6 and 18, the switches 106a–106c are turned off, and in the heating write mode shown in FIGS. 19 and 21, the switches 106a–106c are turned on.

In order to read the information, the switches 103a–103c select the detection signal application circuit 310 and the static capacitance detection circuit 330. The switches 106a–106c are turned off.

In the present embodiment, a desired image is written into and displayed by the liquid panel by the external circuit by heating the electrodes and an operator can add, correct or delete a desired information by a laser pen and the edited information is read out to the external circuit.

While the liquid crystal having the smectic phase has been described in the present embodiment, other dielectric material such as a liquid crystal having a cholesteric phase or a PLZT whose static capacitance changes by the application of electric field or heat and stored for a predetermined time after the removal of the electric field or heat may be used in the present invention.

The means for changing the static capacitance of the dielectric material is not limited to the heating means but it may be other means such as electric field means or current means which can vary the capacitance of the dielectric material.

As described hereinabove, according to the first feature of the present invention, the information holding device made of the smectic liquid crystal is provided with the information reading function so that the information can be inputted and outputted.

According to the second feature of the present invention, the information holding device having the picture cells arranged in the X-Y matrix is not affected by the cross-talk current so that the information can be inputted and outputted with the simple circuit.

We claim:
1. An information holding device comprising:
    a pair of substrates having a first electrode and a second electrode oppositely formed on opposing surfaces thereof;

a dielectric material disposed between said pair of substrates;

means for changing a capacitance of that portion of said dielectric material disposed between said first electrode and said second electrode; and capacitance detecting means for detecting the capacitance of said dielectric material portion disposed between said first electrode and said second electrode, said capacitance detecting means including a circuit for applying a predetermined voltage to said first electrode and a circuit for detecting a current flowing through said second electrode.

2. An information holding device according to claim 1, wherein said dielectric material has a capacitance thereof changed by the application of an electric field or a heat and stored for a predetermined time after the removal of the electric field or the heat.

3. An information holding device according to claim 2 wherein said dielectric material is a liquid crystal having a smectic A phase.

4. An information holding device according to claim 1, wherein said means for changing the capacitance of the dielectric material portions is means for heating said dielectric material.

5. An information holding device according to claim 4, wherein said means for heating said dielectric material is optical means.

6. An information holding device according to claim 1, wherein said predetermined voltage is selected to a voltage which does not cause a significant change in the capacitance of said dielectric material.

7. An information holding device comprising:

a pair of substrates having a plurality of first electrodes and a plurality of second electrodes oppositely formed on opposing surfaces thereof;

a dielectric material disposed between said pair of substrates;

means for changing a capacitance of those portions of said dielectric material disposed between said plurality of first electrodes and said plurality of second electrodes;

a circuit for selectively applying a predetermined voltage to at least one of said plurality of first electrodes and maintaining the rest of said plurality of first electrodes to the same potential as that of said plurality of second electrodes; and a circuit for detecting a current flowing through said second electrodes.

8. An information holding device according to claim 7, wherein said dielectric material has a capacitance thereof changed by the application of an electric field or a heat and stored for a predetermined time after the removal of the electric field or the heat.

9. An information holding device according to claim 8 wherein said dielectric material is a liquid crystal having a smectic A phase.

10. An information holding device according to claim 7, wherein said means for changing the capacitance of the dielectric material portions is means for heating said dielectric material.

11. An information holding device according to claim 10, wherein said means for heating said dielectric material is optical means.

12. An information holding device according to claim 7 wherein said predetermined voltage is selected to a voltage which does not cause a substantial change in the static capacitance of said dielectric material.

13. An information holding device comprising:

a dielectric material disposed between a pair of substrates having first and second electrodes formed on opposite surfaces thereof, respectively, said dielectric material exhibiting a non-write state in which said dielectric material has a first capacitance and a write state in which said dielectric material has a second capacitance changed from said first capacitance by the application of information thereto and held for a predetermined time after the removal of said information therefrom;

information write means for applying said information to said dielectric material to change said dielectric material from said non-write state to said write state; and state detection means operably connected with said first and second electrodes for deriving an electric signal which has a level corresponding to the capacitance of a portion of said dielectric material between said first and second electrodes and indicative of whether the dielectric material portion is at said non-write state or said write state.

14. An information holding device according to claim 13, wherein said dielectric material exhibits said non-write state and said write state at substantially the same temperature.

15. An information holding device according to claim 13, wherein said information write means selectively applies said information to predetermined portions of said dielectric material disposed between said first and second electrodes so as to change said predetermined portions of said dielectric material from said non-write state to said write state, and said state detection means enables detection of which portions of said dielectric material is at the non-write state or the write-state.

16. An information holding device comprising:

a dielectric material disposed between a pair of substrates having at least one first electrode and a plurality of second electrodes formed on opposite surfaces thereof, respectively, said dielectric material exhibiting a non-write state in which said dielectric material has a first capacitance and a write state in which said dielectric material has a second capacitance changed from said first capacitance by the application of information thereto and held for a predetermined time after the removal of said information therefrom;

information write means for selectively applying said information to said dielectric material to change a selected portion of said dielectric material disposed between said first and second electrodes from said non-write state to said write state; and state detection means operably connected with said first and second electrodes for selectively deriving an electric signal which has a level corresponding to the capacitance of a portion of said dielectric material between said at least one first electrode and one of said second electrodes and indicative of whether the dielectric material portion therebetween is at said non-write state or said write state.

17. An information holding device according to claim 16, wherein said dielectric material exhibits said non-write state and said write state at substantially the same temperature.

18. An information holding device according to claim 16, wherein a plurality of first electrodes are provided, said state detection means detecting a signal indicative of whether the dielectric material portion between one of said plurality of first electrodes and one of said plurality of second electrodes is at said non-write or said write state.

19. An information holding device comprising:
a pair of substrates having first electrode means and second electrode means oppositely formed on opposing surfaces thereof;
a dielectric material disposed between said pair of substrates;
means for selectively changing a capacitance of individual portions of said dielectric material disposed between said first and second electrode means to change said selected portions from a first state to a second state; and
capacitance detecting means for detecting the capacitance of individual portions of said dielectric material disposed between said first and second electrode means for indicating whether the individual portions are in a first state or a second state.

20. An information holding device according to claim 19, wherein at least one of said first and second electrode means includes a plurality of electrodes, said means for changing capacitance of portions of said dielectric material changing the capacitance of said dielectric material disposed between different ones of said first and second electrodes.

* * * * *